(12) United States Patent
Kang et al.

(10) Patent No.: US 11,747,663 B2
(45) Date of Patent: Sep. 5, 2023

(54) DISPLAY DEVICE

(71) Applicant: LG ELECTRONICS INC., Seoul (KR)

(72) Inventors: Seunggyu Kang, Seoul (KR); Honghae Do, Seoul (KR); Sungmo Im, Seoul (KR); Sangmin Kim, Seoul (KR); Jaeuk Ryu, Seoul (KR); Youngwook Kang, Seoul (KR); Sanghoon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 84 days.

(21) Appl. No.: 17/444,985

(22) Filed: Aug. 12, 2021

(65) Prior Publication Data
US 2022/0346287 A1   Oct. 27, 2022

(30) Foreign Application Priority Data

Apr. 27, 2021 (KR) .......................... 10-2021-0054415

(51) Int. Cl.
  *G02F 1/1333* (2006.01)
  *H05K 5/02* (2006.01)
  *H05K 7/20* (2006.01)

(52) U.S. Cl.
  CPC ..... *G02F 1/133314* (2021.01); *H05K 5/0217* (2013.01); *H05K 7/20963* (2013.01); *G02F 2201/46* (2013.01); *G02F 2201/503* (2013.01)

(58) Field of Classification Search
  None
  See application file for complete search history.

(56) References Cited

U.S. PATENT DOCUMENTS

| | | | | |
|---|---|---|---|---|
| 2001/0019377 | A1* | 9/2001 | Fukayama | G02F 1/133308 349/58 |
| 2015/0340646 | A1* | 11/2015 | Shin | H01L 51/5237 257/40 |
| 2019/0029129 | A1 | 1/2019 | Kang et al. | |
| 2019/0132963 | A1* | 5/2019 | Yu | H05K 1/189 |

(Continued)

FOREIGN PATENT DOCUMENTS

| | | |
|---|---|---|
| JP | 2015-191078 | 11/2015 |
| JP | 2015191201 | 11/2015 |

(Continued)

OTHER PUBLICATIONS

Korean Intellectual Property Office Application Serial No. 10-2021-0054415, Office Action dated Aug. 22, 2022, 8 pages.

(Continued)

*Primary Examiner* — Shan Liu
(74) *Attorney, Agent, or Firm* — LEE HONG DEGERMAN KANG & WAIMEY

(57) ABSTRACT

A display device is disclosed. The display device includes a display panel; a material complexed plate located at a rear of the display panel; a side frame which is located between the display panel and the material complexed plate, is fixed to the material complexed plate, and to which the display panel is coupled, wherein the material complexed plate includes a front skin forming a front surface; a rear skin which forms a rear surface and faces the front skin; and a core which is located between the front skin and the rear skin, and includes fibers.

15 Claims, 19 Drawing Sheets

(56) References Cited

U.S. PATENT DOCUMENTS

2020/0201382 A1* 6/2020 Lee .................. G06F 1/1601
2020/0233255 A1* 7/2020 Lin .................. G02F 1/133504

FOREIGN PATENT DOCUMENTS

| | | |
|---|---|---|
| JP | 2021-009369 | 1/2021 |
| JP | 2021-011736 | 2/2021 |
| KR | 1020170082043 | 7/2017 |
| KR | 20170120001 A * | 10/2017 |
| KR | 1020170120001 | 10/2017 |
| KR | 101832301 | 2/2018 |

OTHER PUBLICATIONS

European Patent Office Application Serial No. 21190141.8, Search Report dated Jan. 31, 2022, 13 pages.
Japan Patent Office Application No. 2022-072051, Office Action dated Mar. 28, 2023, 5 pages.

* cited by examiner

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2021-0054415, filed on Apr. 27, 2021, the contents of which are all hereby incorporated by reference herein in its entirety.

BACKGROUND OF THE INVENTION

Field of the Invention

The present disclosure relates to a display device.

Description of the Related Art

As information society develops, the demand for display devices has also been increased in various forms. In response to this trend, in recent years, various display devices such as Liquid Crystal Display Device (LCD), Plasma Display Panel (PDP), Electro luminescent Display (ELD), Vacuum Fluorescent Display (VFD), Organic Light Emitting Diode (OLED), and the like have been researched and used.

Among them, a display device using an organic light emitting diode (OLED) has an advantage of being implemented in an ultra-thin type as it has excellent luminance and viewing angle characteristics in comparison with a liquid crystal display device, and does not require a backlight unit.

Recently, a lot of researches have been accomplished on a structure for securing rigidity of a large-screen ultra-thin display device and dissipating heat according to high image quality.

SUMMARY OF THE INVENTION

It is an object of the present disclosure to solve the above and other problems.

It is another object of the present disclosure to secure structural rigidity of a large-screen ultra-thin display device.

It is another object of the present disclosure to provide a display device having a heat dissipation structure capable of dissipating heat due to high image quality.

In accordance with an aspect of the present disclosure, a display device includes a display panel; a material complexed plate located at a rear of the display panel; a side frame which is located between the display panel and the material complexed plate, is fixed to the material complexed plate, and to which the display panel is coupled, wherein the material complexed plate includes a front skin forming a front surface; a rear skin which forms a rear surface and faces the front skin; and a core which is located between the front skin and the rear skin, and includes fibers.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION OF THE PREFERRED EMBODIMENTS

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, step differences, operations, elements, components, or combinations thereof described in the specification, but do not preclude the presence or addition of one or more other features, numbers, step differences, operations, elements, components, or combinations thereof.

Figure 1:
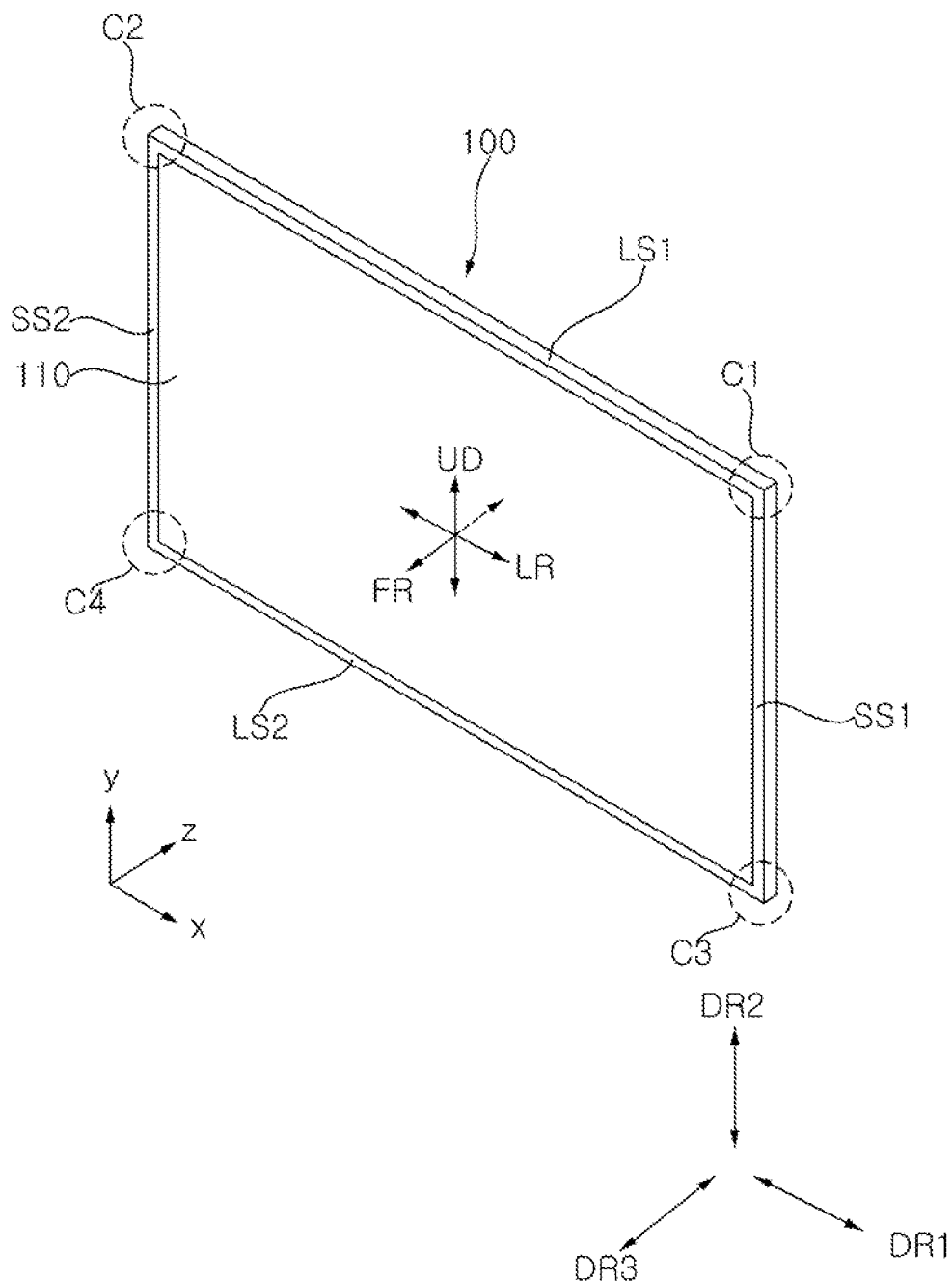
FIGS. 1 to 19 are drawings illustrating examples of a display device according to embodiments of the present disclosure.

Referring to FIG. 1, a display device 100 may include a display panel 110.

The display panel 110 may display a screen.

The display device 100 may include a first long side LS1, a second long side LS2 facing the first long side LS1, a first short side SS1 adjacent to the first long side LS1 and the second long side LS2, and a second short side SS2 facing the first short side SS1. For convenience of explanation, it is illustrated and described that the lengths of the first and second long sides LS1 and LS2 are longer than the lengths of the first and second short sides SS1 and SS2, but it may also be possible that the lengths of the first and second long sides LS1 and LS2 are approximately equal to the lengths of the first and second short sides SS1 and SS2.

A direction parallel to the long side (LS1, LS2) of the display device 100 may be referred to as a first direction DR1 or a left-right direction LR. A direction parallel to the short side (SS1, SS2) of the display device 100 may be referred to as a second direction DR2 or a vertical direction UD.

A direction perpendicular to the long side (LS1, LS2) and the short side (SS1, SS2) of the display device 100 may be referred to as a third direction DR3 or a front-rear direction FR. Here, a direction in which the display panel 110 displays a screen may be referred to as a front, and a direction opposite to this may be referred to as a rear.

Hereinafter, a display panel using an organic light emitting diode (OLED) will be described as an example for the display panel 110, but the display panel 110 applicable to the present disclosure is not limited thereto.

The display panel 110 may form a front surface of the display device 100 and may display to a front. The display panel 110 may divide an image into a plurality of pixels and output an image by adjusting color, brightness, and saturation for each pixel. The display panel 110 may be divided into an active area in which an image is displayed and a de-active area in which an image is not displayed. The display panel 110 may generate light corresponding to a color of red, green, or blue according to a control signal.

Figure 2:
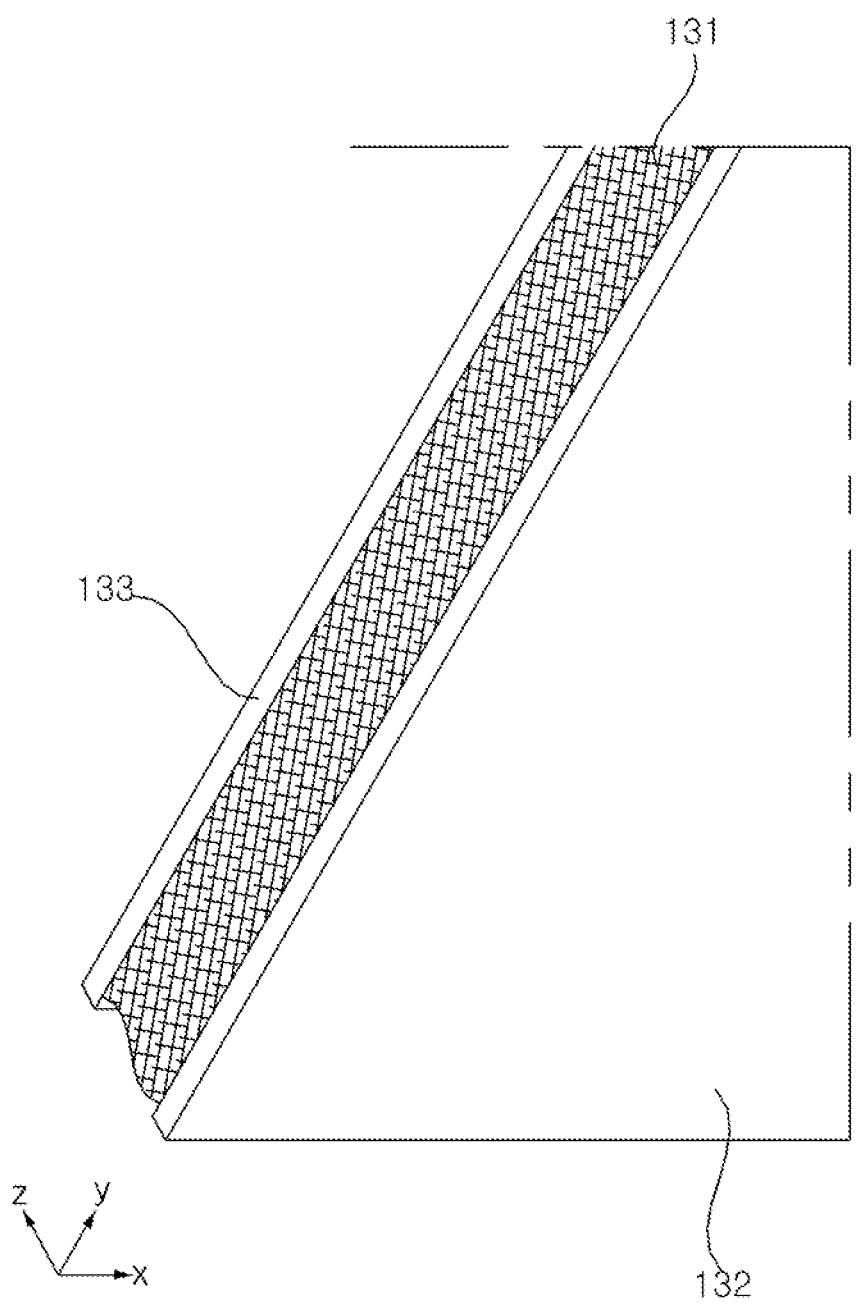

Referring to FIG. 2, a material complexed panel 130 may include a core 131, a front skin 132, and a rear skin 133. The core 131, the front skin 132, and the rear skin 133 may be coupled to each other. The material complexed panel 130 may be referred to as a fiber complexed panel 130, a fiber complexed plate 130, a material complexed plate 130, or a middle frame 130.

The front skin 132 may form a front surface of the material complexed panel 130. The rear skin 133 may form a rear surface of the material complexed panel 130. The front skin 132 and the rear skin 133 may include a metal material. For example, the front skin 132 and the rear skin 133 may include an aluminum Al material. For example, the thickness of the front skin 132 and the rear skin 133 may be about 0.5 mm. The front skin 132 and the rear skin 133 may face each other with respect to the core 131 described later.

The core 131 may be located between the front skin 132 and the rear skin 133. The core 131 may include a fiber. The core 131 may be formed of a composite material. The core 131 may include a main fiber and a binder fiber. The binder fiber may be mixed with the main fiber.

A hot melt sheet may be located between the front skin 132 and the core 131, and the hot melt sheet may be located between the rear skin 133 and the core 131. The hot melt sheet may be a film. For example, the hot melt sheet may be a film made of EVA, acrylic, polyurethane, or the like having a thickness of 50 micrometers or more. After the core 131 is located between the front skin 132 and the rear skin 133 by the hot melt sheet, roll lamination may be performed at 190 degrees Celsius for 1 minute or more.

Accordingly, bending rigidity and/or torsional rigidity of the display device may be improved.

Figure 3:
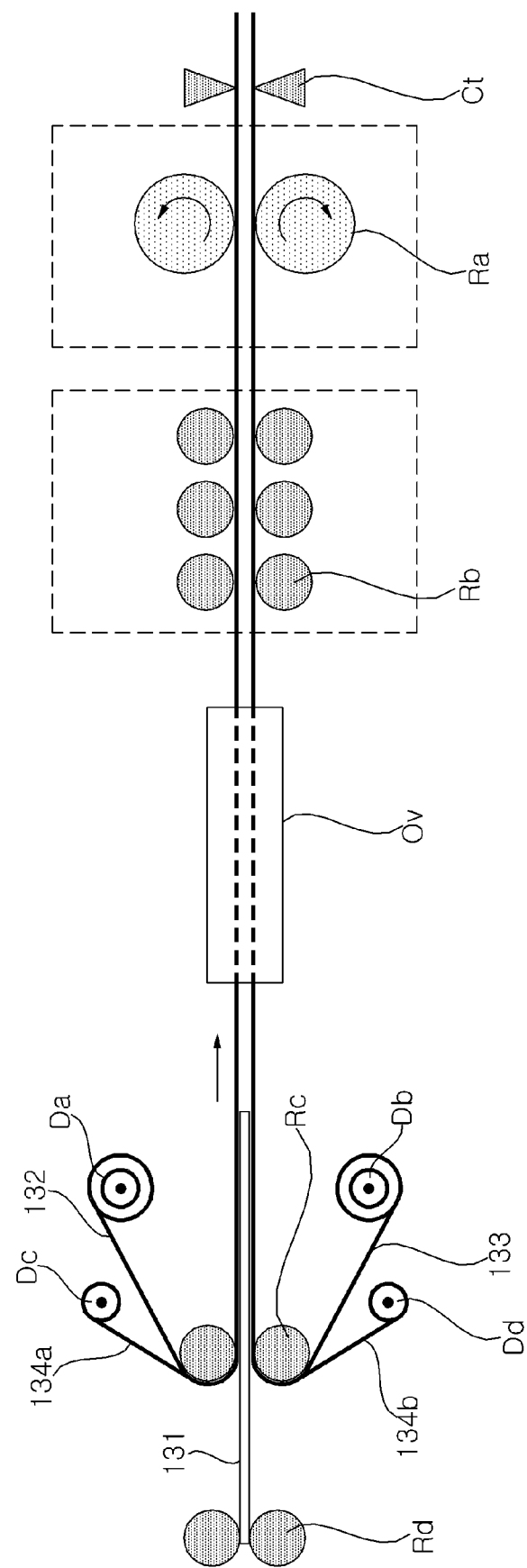
Figure 4:
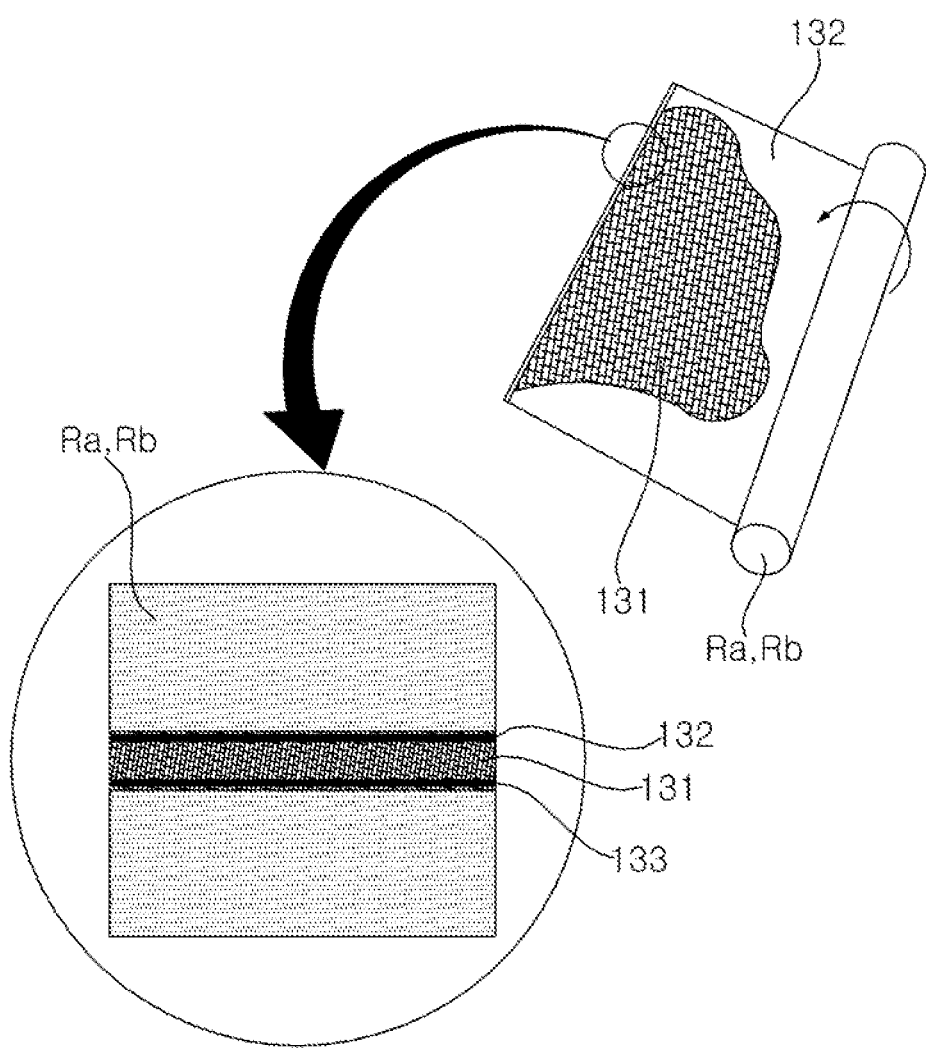

Referring to FIGS. 3 and 4, the material complexed panel 130 may be manufactured through a process of pressing the front skin 132 and the rear skin 133 to the core 131 using a plurality of rollers, and such a process may be referred to as a roll-to-roll (R2R) process.

Referring to FIG. 3, according to the rotation of a pinch roller Ra performing the function of a drive motor, the front skin 132 may be unwound from a front drum Da, the rear skin 133 may be unwound from a rear drum Db, and the core 131 may be moved through a feeding roller Rd. In addition, a first adhesive 134a for coupling the front skin 132 to the core 131 may be unwound from a first drum Dc. In addition, a second adhesive 134b for coupling the rear skin 133 to the core 131 may be unwound from a second drum Dd. In this case, the front skin 132, the first adhesive 134a, the core 131, the second adhesive 134b, and the rear skin 133 are laminated in the above order, and may be guided in a direction toward an oven Ov by a guide roller Rc. The adhesive 134a and 134b may be the hot melt sheet 134a and 134b.

The first and second adhesives 134a and 134b are melted in the oven Ov, and each of the front skin 132 and the rear skin 133 may be coupled to the core 131. For example, the melting point of the first and second adhesives 134a and 134b may be about 150° C., and the atmosphere temperature of the oven Ov may be about 200° C. For example, the peel-off force of the first and second adhesives 134a and 134b may be about 10 kgf or more.

The front skin 132, the core 131, and the rear skin 133 that have passed through the oven Ov may be guided to a pressing roller Rb and compressed by the pressing roller Rb, according to the rotation of the pinch roller Ra. Accordingly, the mutual coupling force among the front skin 132, the core 131, and the rear skin 133 may be further increased. The front skin 132, the core 131, and the rear skin 133 coupled to each other may pass through the pinch roller Ra and then may be cut by a cutter Ct, so that a material complexed panel 130 having a certain size may be manufactured.

Referring to FIG. 4, the pressing roller Rb or the pinch roller Ra may contact an outer surface of each of the front skin 132 and the rear skin 133. When the pressing roller Rb or the pinch roller Ra rotates, the material complexed panel 130 may be moved in the length direction (i.e. the left-right direction LR) of the core 131. In this case, the front skin 132 and the rear skin 133 may be sequentially coupled from one end to the other end of the core 131 in the length direction of the core 131.

In addition, the front skin 132 and the rear skin 133 of the material complexed panel 130 may be formed to be flat. That is, as the rear surface of the rear skin 133 forming the rear surface of the display device 100 is formed to be flat, it may be easy to perform additional operations such as painting or attaching sheet paper on the rear surface of the rear skin 133 for an aesthetically pleasing appearance.

Meanwhile, in addition to forming the front skin 132 and the rear skin 133 to be flat through the R2R process described above with reference to FIGS. 3 and 4, it is also possible to couple the core 131, the front skin 132, and the rear skin 133 through a process of stacking the front skin 132, the core 131, and the rear skin 133 sequentially and then coupling them.

Figure 5:
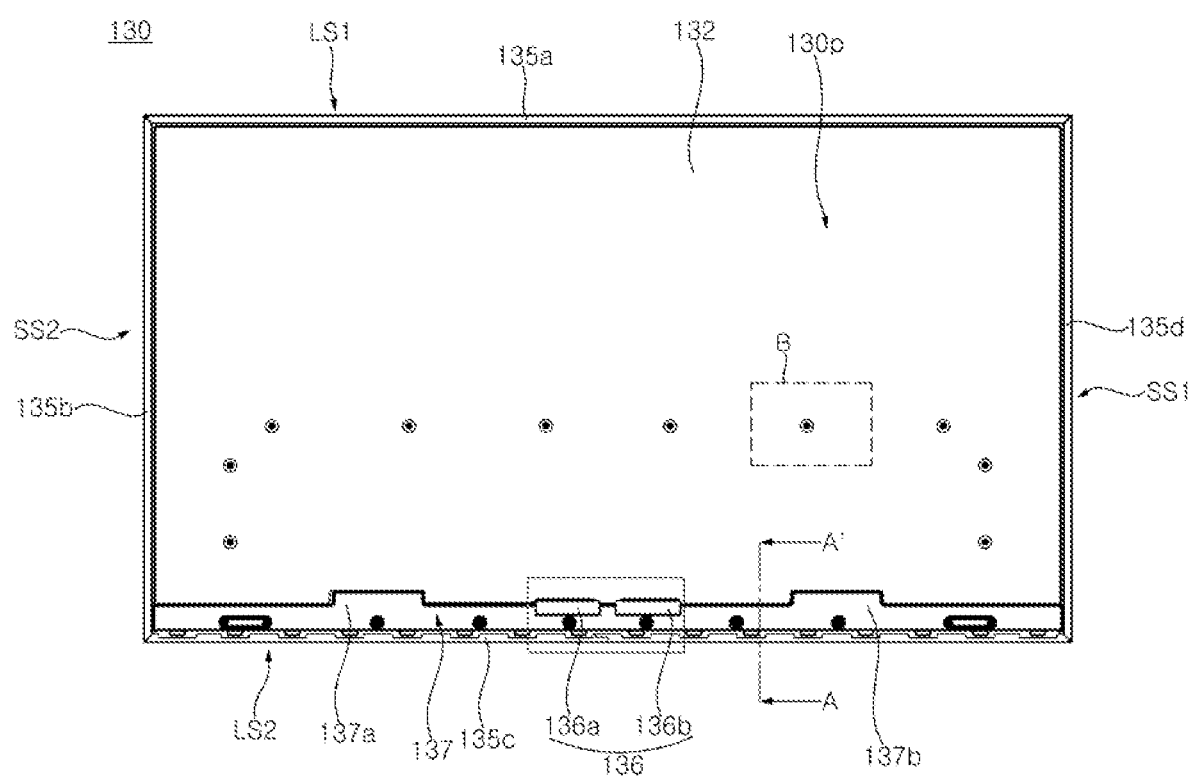

Referring to FIG. 5, the material complexed panel 130 may include a flat plate part 130P, a receiving part 137, and an outer part 135. The outer part 135 may be formed around the flat plate part 130P. A first outer part 135a may be formed along the upper side of the flat plate part 130P, a second outer part 135b may be formed along the left side of the flat plate part 130P, a third outer part 135c may be formed along the lower side of the flat plate part 130P, and a fourth outer part 135d may be formed along the right side of the flat plate part. The outer part 135 may be formed while the flat plate part 130P is pressed. The outer part 135 may form a step difference while being lowered from the flat plate part 130P. The thickness of the flat plate part 130P may be greater than the thickness of the outer part 135.

A cable hole 136 may be formed to penetrate the front skin 132 (refer to FIG. 2) and the rear skin 133 (refer to FIG. 2) of the receiving part 137. The cable hole 136 may be formed in the receiving part 137 adjacent to the lower side of the flat plate part 130P. The cable hole 136 may be plural. A first cable hole 136a may be located adjacent to a second cable hole 136b.

The receiving part 137 may be formed between the flat plate part 130P and the third outer part 135c while being adjacent to the lower side of the flat plate part 130P. The receiving part 137 may be plural. The first receiving part 137a may be located between the first cable hole 136a and the second short side SS2. The second receiving part 137b may be located between the second cable hole 136b and the first short side SS1. The receiving part 137 may be formed while the flat plate part 130P is pressed. The receiving part 137 may form a step difference while being lowered from the flat plate part 130P and/or the outer part 135c.

Figure 6:
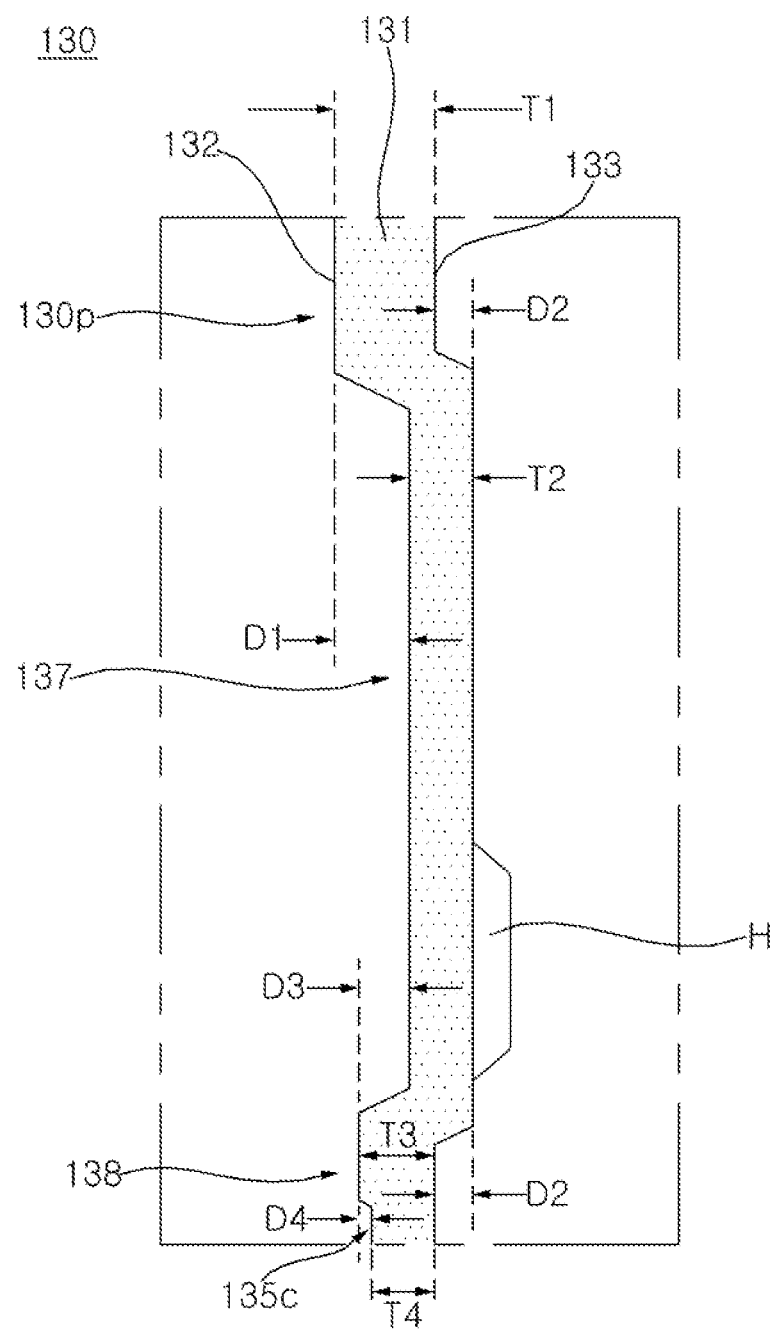

Referring to FIG. 6, the receiving part 137 may be formed while the flat plate part 130P is pressed. The front skin 132 of the receiving part 137 may form a step difference D1 that is lowered from the front skin 132 of the flat plate part 130P. The rear skin 133 of the receiving part 137 may form a step difference D2 that rises from the rear skin 133 of the flat plate part 130P. At this time, the height of the step difference D1 lowered from the front skin 132 of the flat plate part 130P to the front skin 132 of the receiving part 137 may be higher than the height of the step difference D2 that rises from the rear skin 133 of the flat plate part 130P to the rear skin 133 of the receiving part 137. A thickness T1 of the flat plate part 130P may be greater than a thickness T2 of the receiving part 137.

A core 131 of the material complexed panel 130 may absorb an external force while being pressed in the direction from the front skin 132 of the flat plate part 130P to the rear skin 133. The magnitude of the external force applied to the front skin 132 of the flat plate part 130P may be greater than the magnitude of the external force applied to the rear skin 133 of the flat plate part 130P. The core 131 of the material complexed panel 130 may absorb impact as well as secure rigidity.

A thickness T4 of the third outer part 135c may be greater than a thickness T2 of the receiving part 137. A step difference D2 that rises from the rear skin 133 of the third outer part 135c to the rear skin 133 of the receiving part 137 may be formed. The height of the step difference D2 between the rear skin 133 of the third outer part 135c and the rear skin 133 of the receiving part 137 may be the same as the height of the step difference D2 between the rear skin 133 of the receiving part 137 and the rear skin 133 of the flat plate part 130P.

A protrusion pad 138 may be formed to protrude from the front skin 132 of the third outer part 135c. The front skin 132 of the protrusion pad 138 may form a step difference D4 lowered to the front skin 132 of the third outer part 135c. The height of the step difference D4 formed by the third outer part 135c and the protrusion pad 138 may be smaller than the height of the step differences D1 and D2 formed by the flat plate part 130P and the receiving part 137. The thickness T3 of the protrusion pad 138 may be greater than the thickness T4 of the third outer part 135c, may be smaller than the thickness T1 of the flat plate part 130P, and may be smaller than the thickness T2 of the receiving part 137.

A fastening groove H may protrude from the rear skin 133 of the receiving part 137. The fastening groove H may be recessed in the front skin 132 of the receiving part 137 and protrude from the rear skin 133 of the receiving part 137. The center of the fastening groove H may be penetrated.

Figure 7:
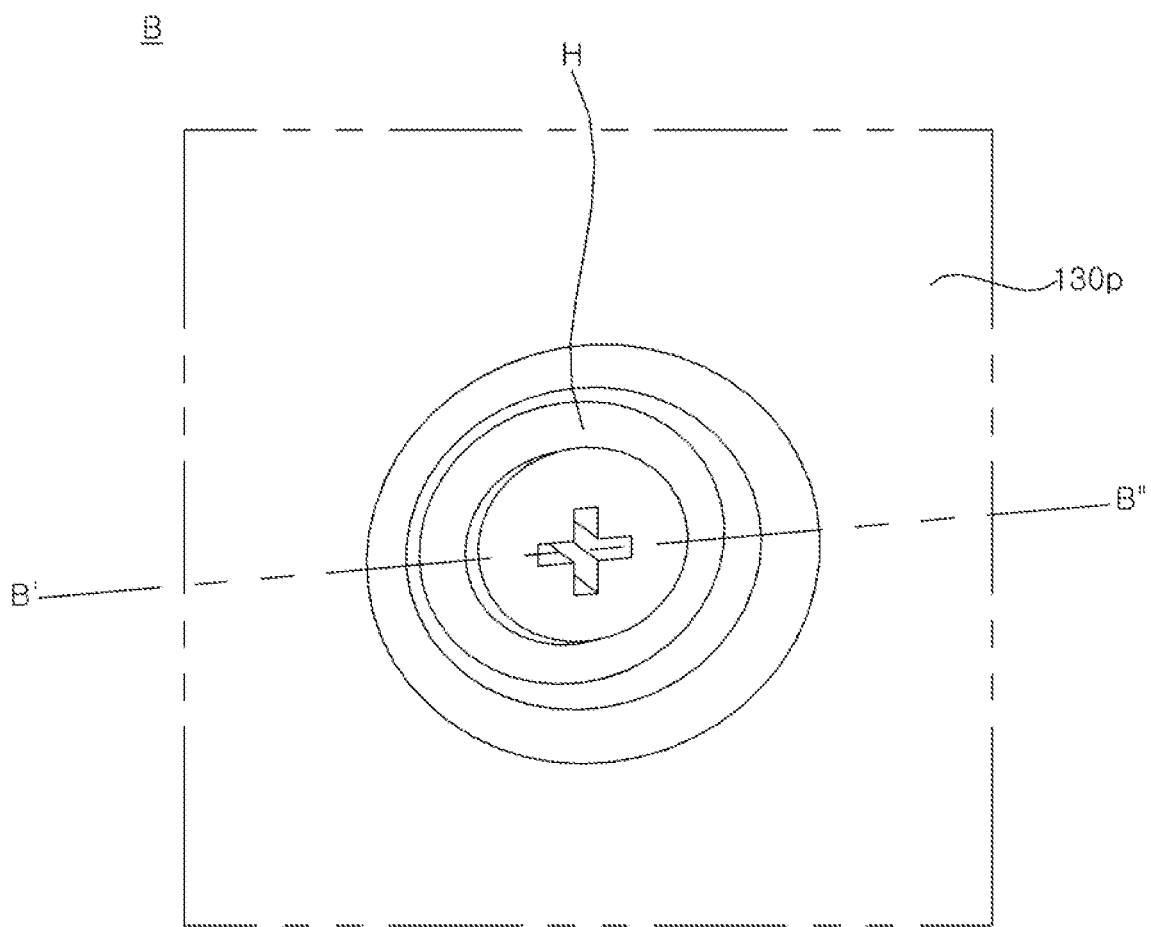
Figure 8:
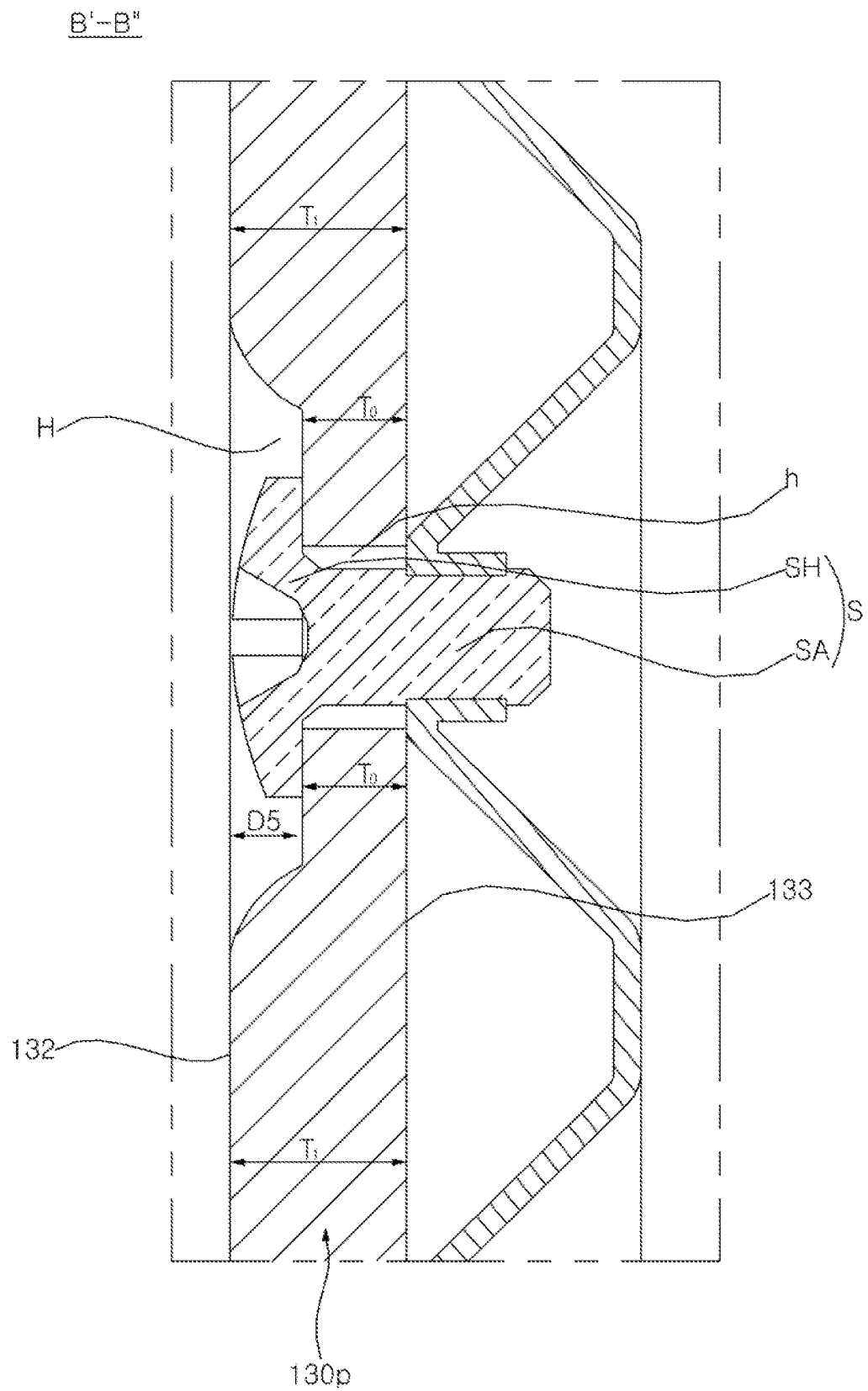

Referring to FIGS. 7 and 8, the fastening groove H may be formed in the flat plate part 130P. The fastening groove H may be formed while the flat plate part 130P is pressed. The front skin 132 of the fastening groove H may be formed by being recessed from the front skin 132 of the flat plate part 130P. The rear skin 133 of the flat plate part 130P and the rear skin 133 of the fastening groove H may form the same plane. The thickness T0 of the fastening groove H may be smaller than the thickness T1 of the flat plate part 130P.

A fastening hole h may be formed in the center of the fastening groove H. The fastening hole h may be formed by punching the fastening groove H. The fastening hole h may be formed to penetrate the front skin 132 and the rear skin 133 of the fastening groove H. The length of a shaft SA of the fastening member S may be greater than the thickness T0 of the fastening groove H. The shaft SA of the fastening member S may be inserted into the fastening groove H and protrude to the outside of the rear skin 132 of the fastening groove H through the fastening hole h. The depth D5 of the fastening groove H may be greater than the thickness of a head SH. The head SH of the fastening member S may be hidden in the fastening groove H.

Figure 9:
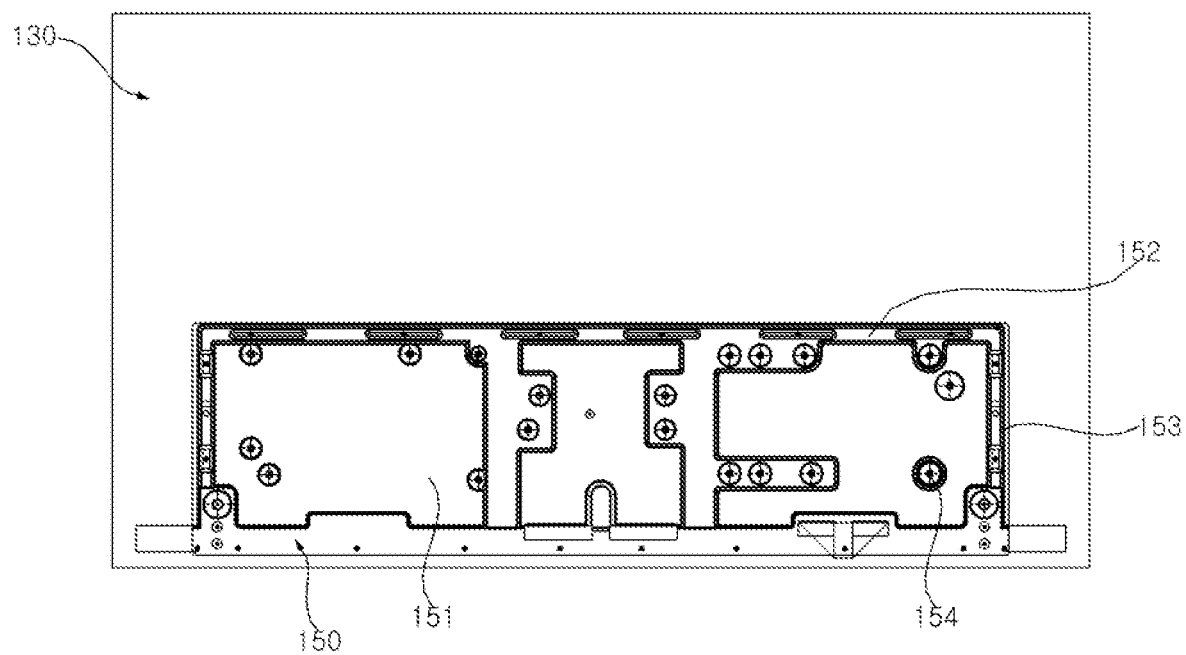
Figure 10:
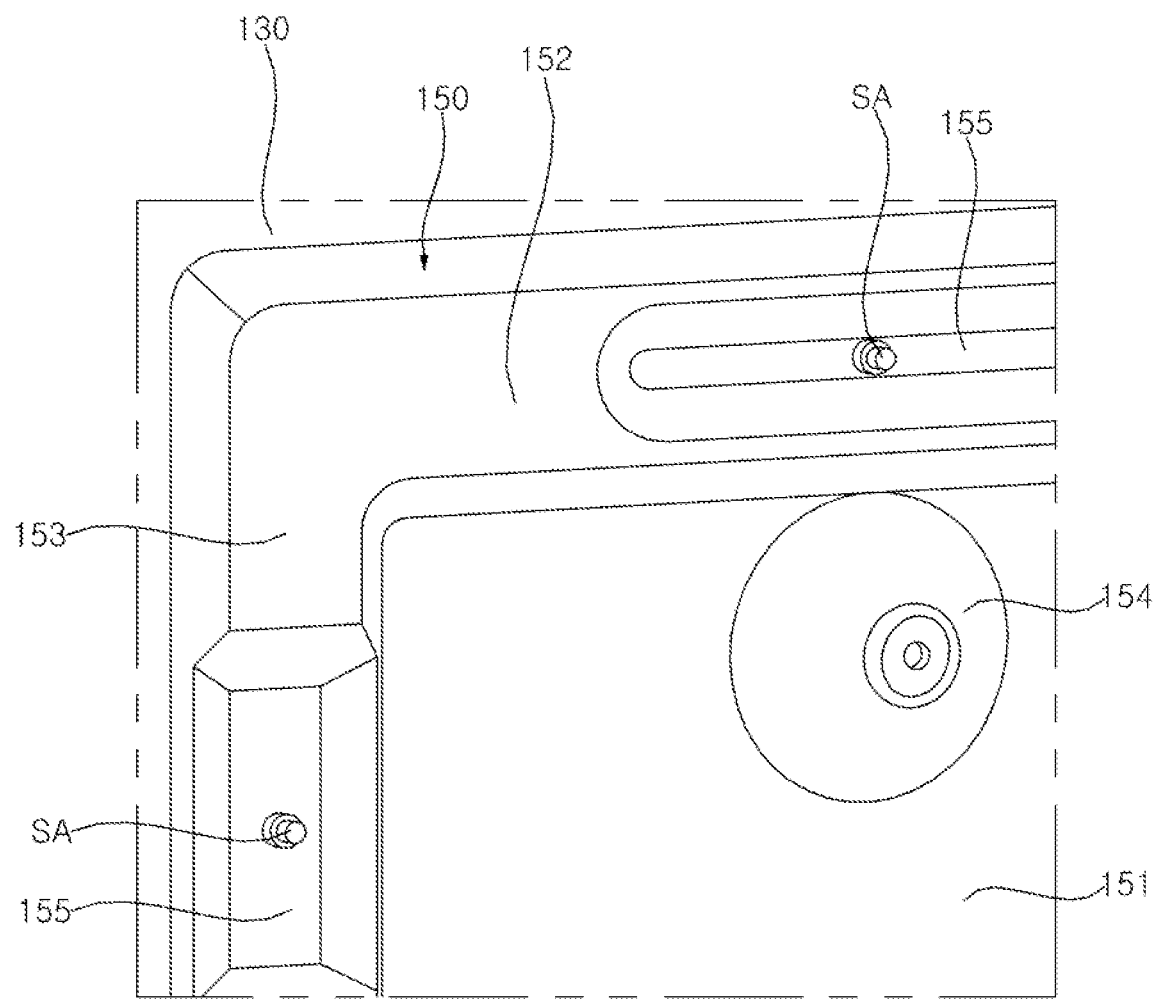

Referring to FIGS. 9 and 10 together with FIG. 8, a PCB plate 150 may be coupled to the rear of the material complexed panel 130. The PCB plate 150 may be fixed to the rear of the material complexed panel 130 by the fastening member S.

The PCB plate 150 may be formed by pressing a plate 151 including a metal. The PCB plate 150 may include a horizontal part 152, a vertical part 153, a dome part 154, and a recessed part 155. The horizontal part 152 protrudes from the front to the rear of the PCB plate 151, and may be formed in the left and right direction of the PCB plate 151. The vertical part 153 may protrude from the front to the rear of the PCB plate 151, and may be formed in the vertical direction of the PCB plate 150. The dome part 154 may protrude from the front to the rear of the PCB plate 150. The recessed part 155 may be recessed from the rear of the vertical part 153 and/or the horizontal part 152 to the front.

The shaft SA of the fastening member S may penetrate the recessed part 155 formed in the vertical part 153 and/or the horizontal part 152 to couple the material complexed panel 130 and the PCB plate 150 to each other. The depth of the recessed part 155 may be greater than the protrusion length of the shaft SA of the fastening member S penetrating the material complexed panel 130 and protruding to the rear.

Figure 11:
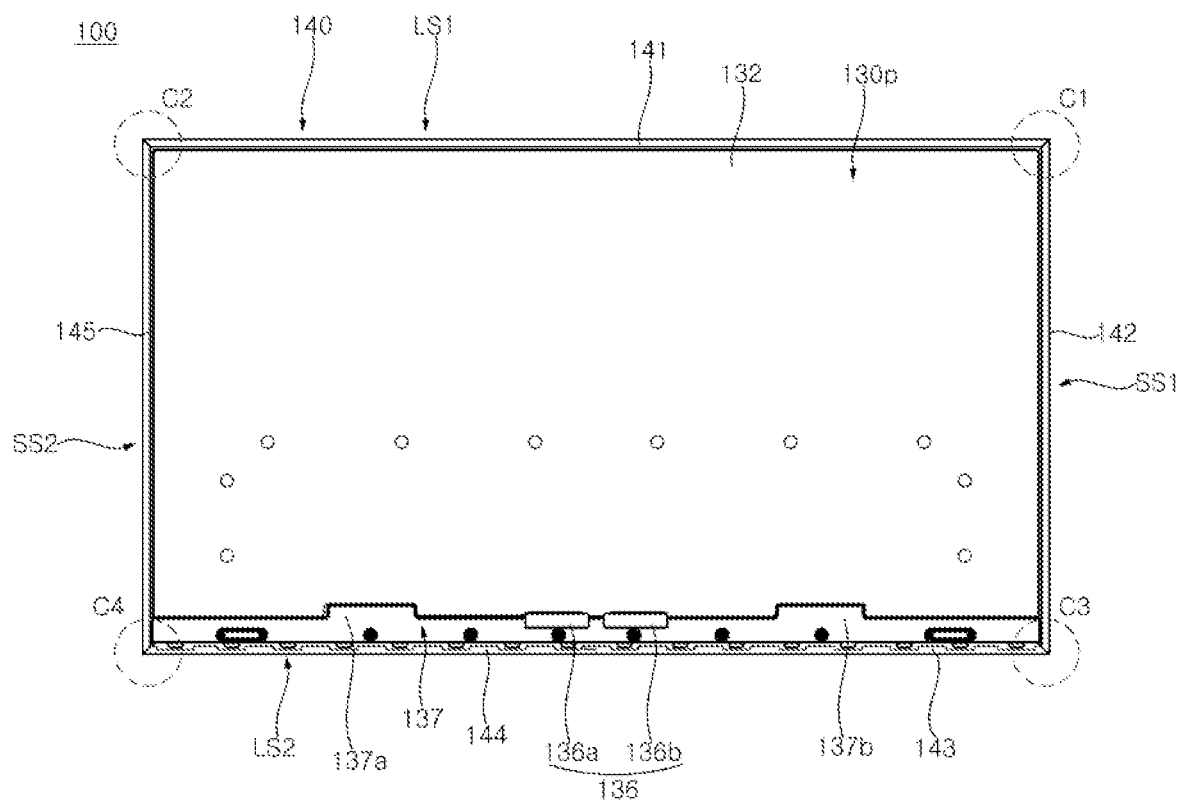
Figure 12:
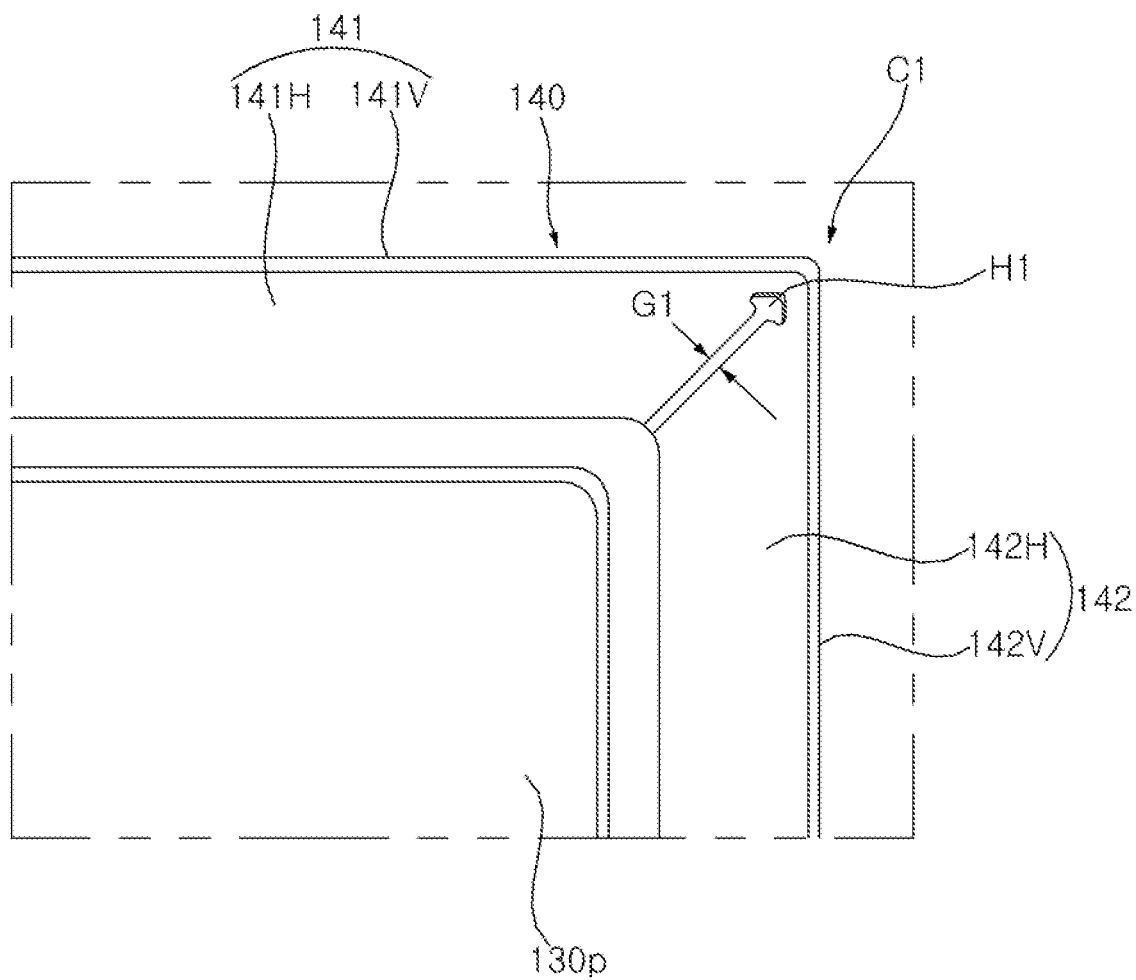

Referring to FIGS. 11 and 12, the side frame 140 may be coupled to the outer part 135 (refer to FIG. 5) adjacent to the flat plate part 130P. The side frame 140 may include a first part 141, a second part 142, a third part 143, a fourth part 144, and a fifth part 145. The second part 142 may be bent at a first corner C1 from the first part 141.

The first part 141 may include a horizontal part 141H and a vertical part 141V. The horizontal part 141H of the first part 141 may be fixed to the first outer part 135a (refer to FIG. 5). The second part 142 may include a horizontal part 142H and a vertical part 142V. The horizontal part 142H of the second part 142 may be fixed to the fourth outer part 135d (refer to FIG. 5).

A gap G1 may be formed between the horizontal part 141H of the first part 141 and the horizontal part 142H of the second part 142. The vertical part 141V of the first part 141 and the vertical part 142V of the second part 142 may be connected while being bent. A hole H1 connected to the gap G1 may be formed between the horizontal parts 141H and 142H while being adjacent to the vertical parts 141V and 142V. The size of the hole H1 or the diameter of the hole H1 may be greater than the width of the gap G1. The description of the first corner C1 of the side frame 140 may be identically applied to a second corner C2 of the side frame 140.

Figure 13:
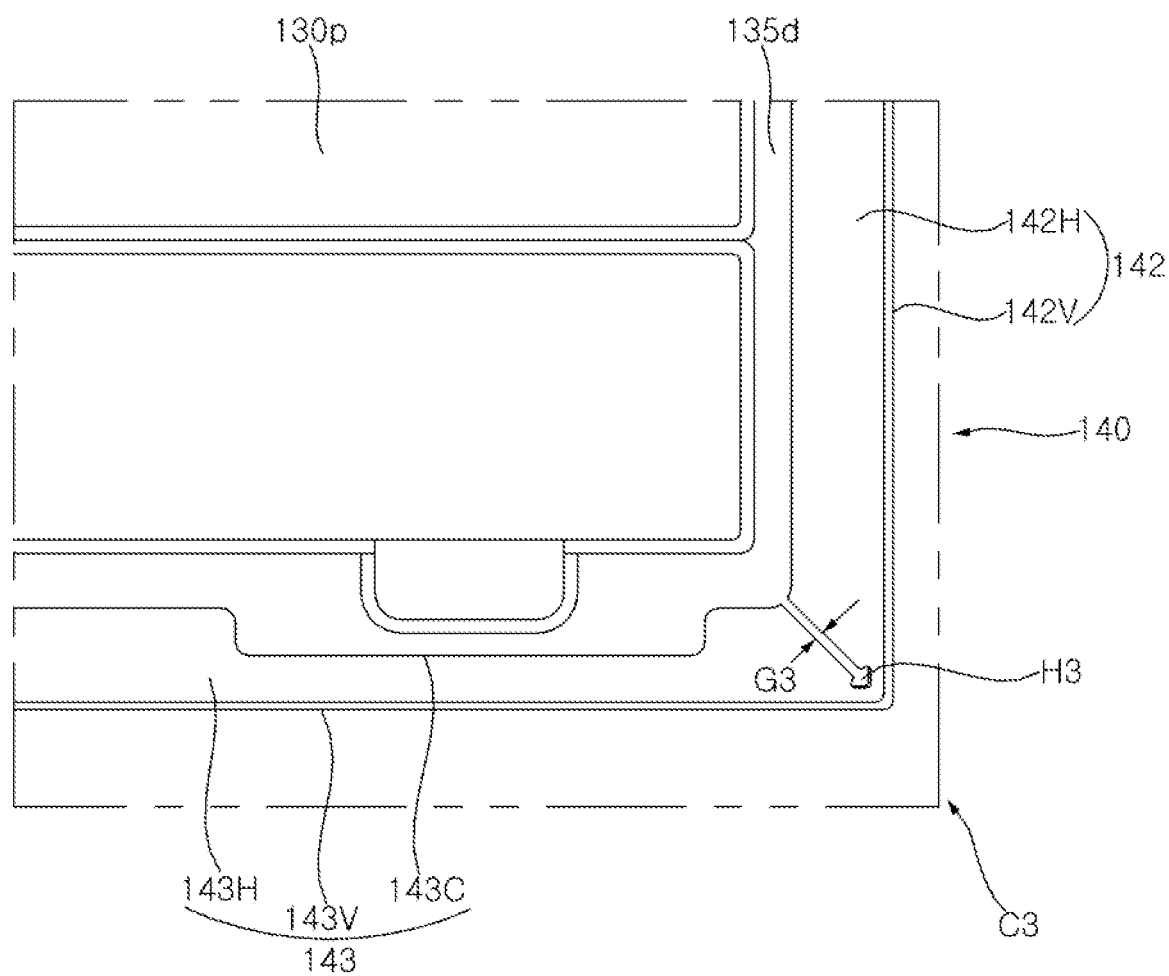

Referring to FIGS. 11 and 13, the side frame 140 may be adjacent to the flat plate part 130P to be coupled to the outer part 135 (refer to FIG. 5). The side frame 140 may include a first part 141, a second part 142, a third part 143, a fourth part 144, and a fifth part 145. The second part 142 may be bent at a third corner C3 from the third part 143.

The third part 143 may include a horizontal part 143H and a vertical part 143V. The horizontal part 143H of the third part 143 may be fixed to the third outer part 135c (refer to FIG. 5). The second part 142 may include a horizontal part 142H and a vertical part 142V. The horizontal part 142H of the second part 142 may be fixed to the fourth outer part 135d (refer to FIG. 5).

A gap G3 may be formed between the horizontal part 143H of the third part 143 and the horizontal part 142H of the second part 142. The vertical part 143V of the third part 143 and the vertical part 142V of the second part 142 may be connected while being bent. A hole H3 may be formed adjacent to the vertical parts 143V and 142V and connected to the gap G3 between the horizontal parts 143H and 142H. The size of the hole H3 or the diameter of the hole H3 may be greater than the width of the gap G3. The description of the first corner C3 of the side frame 140 may be identically applied to a fourth corner C4 of the side frame 140.

Figure 14:
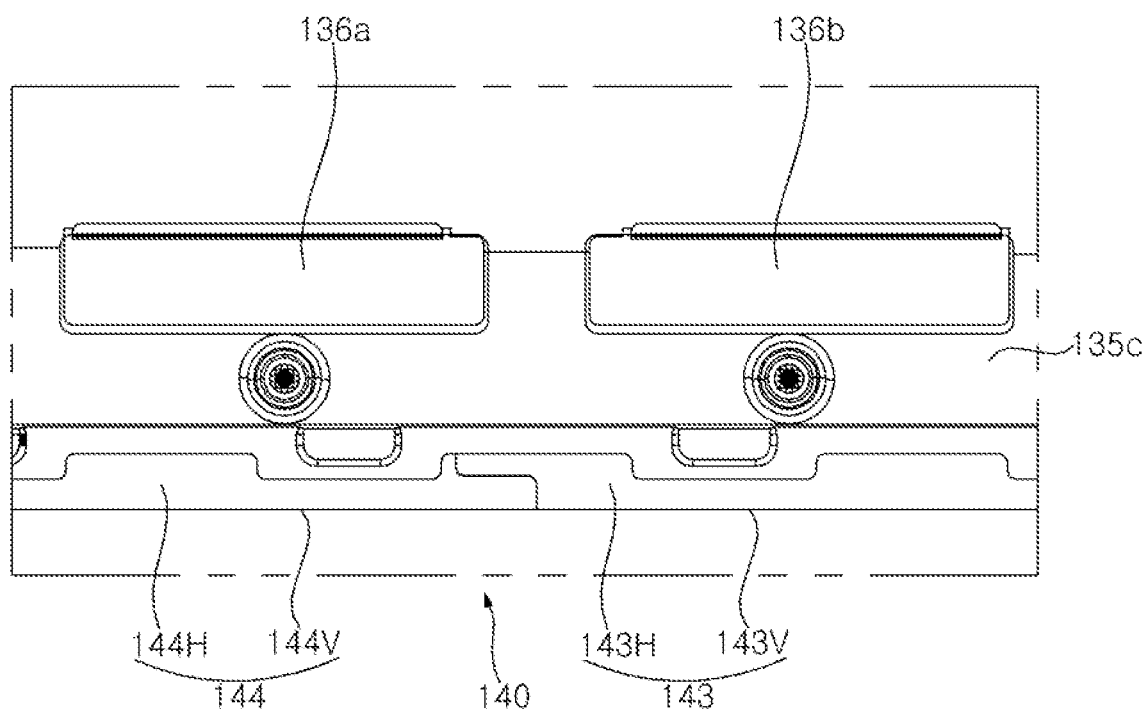

Referring to FIGS. 11 and 14, the third part 143 and the fourth part 144 of the side frame 140 may be located in or fixed to the third outer part 135c. A distal end of the third part 143 of the side frame 140 may be coupled to a distal end of the fourth part 144 of the side frame 140.

The horizontal part 144H of the fourth part 144 may contact the horizontal part 143H and the vertical part 143V of the third part 143. The vertical part 144V of the fourth part 144 may contact the vertical part 143V of the third part 143. The vertical part 143V of the third part 143 may contact the horizontal part 144H and the vertical part 144V of the fourth part 144. The distal end of the third part 143 may be fixed to the distal end of the fourth part 144. For example, the distal end of the third part 143 and the distal end of the fourth part 144 may be fixed by welding.

Figure 15:
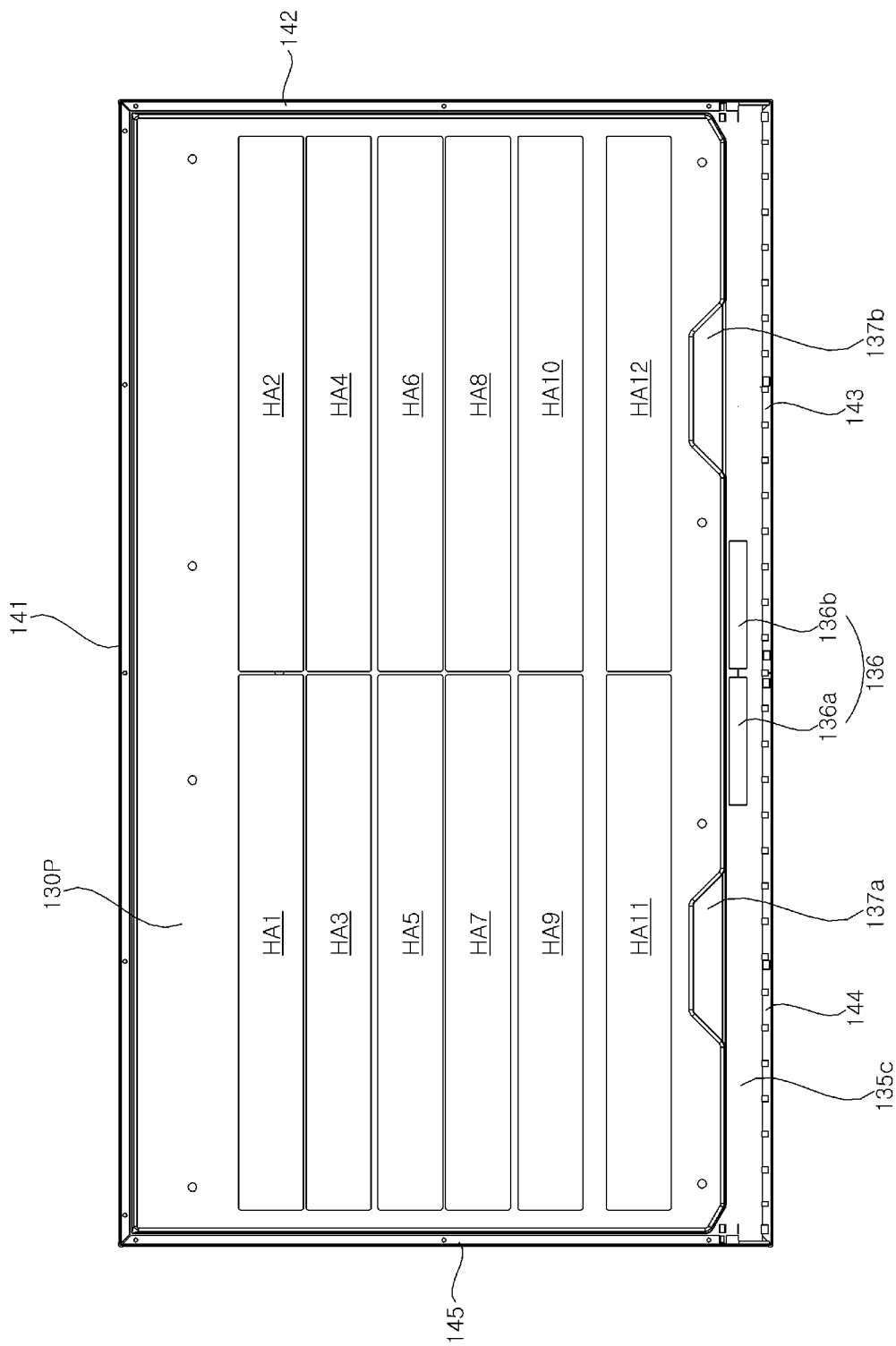

Referring to FIG. 15, a heat sink HA may be extended long to be fixed to the flat plate part 130P. The heat sink HA may be plural. For example, the heat sink HA may be a plate including aluminum. As another example, the heat sink HA may be a tape including aluminum. The heat sink HA may be plural.

A first heat sink HA1 may extend long in the left and right direction of the flat plate part 130P and may be located adjacent to the first part 141 of the side frame 140. A second heat sink HA2 may extend long in the left and right direction of the flat plate part 130P and may be adjacent to the first part 141 of the side frame 140, while adjoining the first heat sink HAL The first heat sink HA1 and the second heat sink HA2 may be sequentially disposed along the length direction of the first part 141 of the side frame 140.

A third heat sink HA3 may extend long in the left and right direction, and may be located adjacent to the first heat sink HA1 in the lower side of the first heat sink HAL A fourth heat sink HA4 may extend long in the left and right direction, and may be located adjacent to the second heat sink HA2 in the lower side of the second heat sink HA2.

A fifth heat sink HA5 may extend long in the left and right direction, and may be located adjacent to the third heat sink HA3 in the lower side of the third heat sink HA3. A sixth heat sink HA6 may extend long in the left and right direction, and may be located adjacent to the fourth heat sink HA4 in the lower side of the fourth heat sink HA4.

A seventh heat sink HA7 may extend long in the left and right direction, and may be located adjacent to the fifth heat sink HA5 in the lower side of the fifth heat sink HA5. An eighth heat sink HA8 may extend long in the left and right direction, and may be located adjacent to the sixth heat sink HA6 in the lower side of the sixth heat sink HA6.

A ninth heat sink HA9 may extend long in the left and right direction, and may be located adjacent to the seventh heat sink HA7 in the lower side of the seventh heat sink HA7. A tenth heat sink HA10 may extend long in the left and right direction, and may be located adjacent to the eighth heat sink HA8 in the lower side of the eighth heat sink HA8.

An eleventh heat sink HA11 may extend long in the left and right direction, and may be located adjacent to the ninth heat sink HA9 in the lower side of the ninth heat sink HA9. A twelfth heat sink HA12 may extend in the left and right direction, and may be located adjacent to the tenth heat sink HA10 in the lower side of the tenth heat sink HA10.

Figure 16:
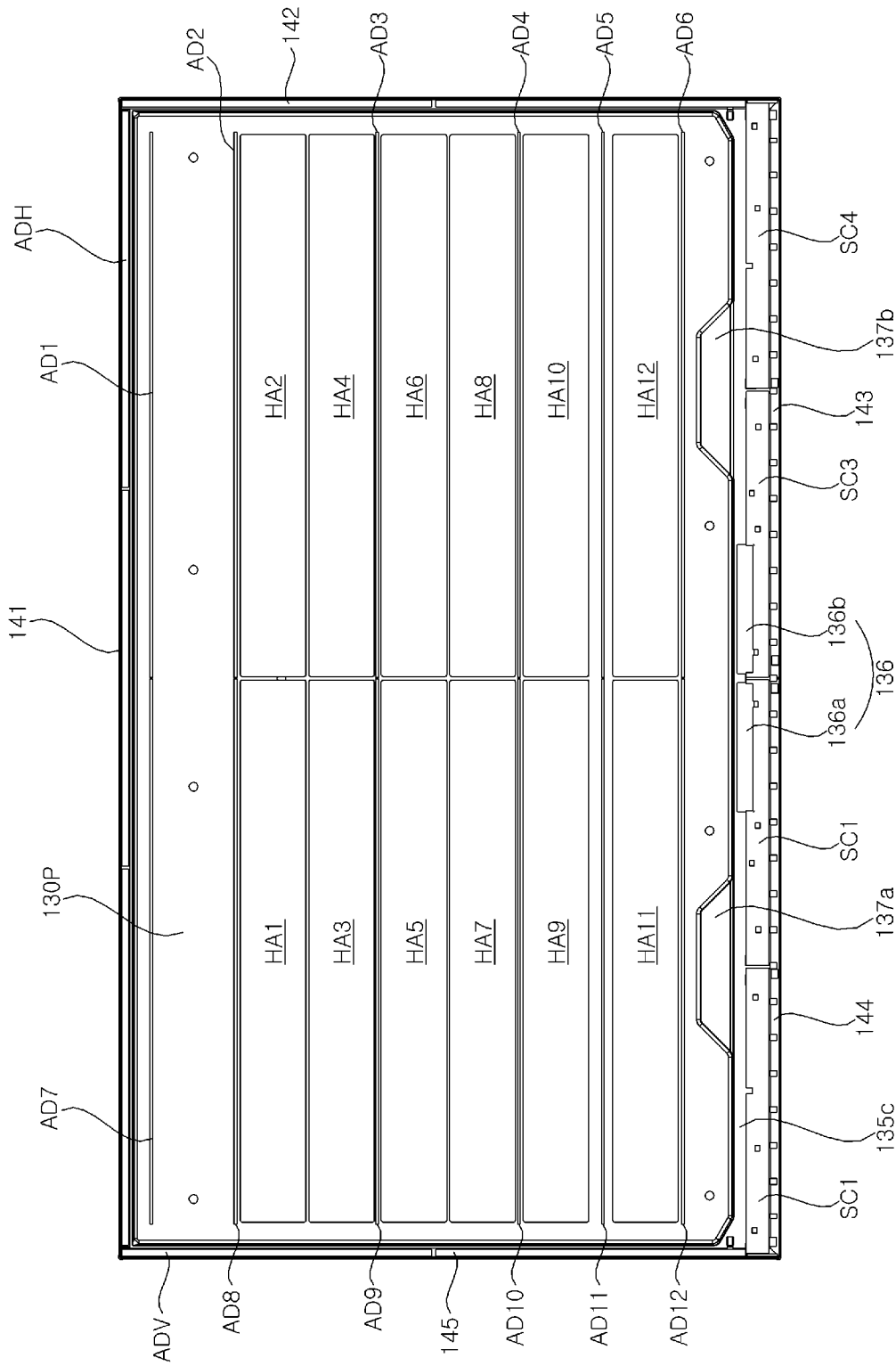

Referring to FIG. 16, a side adhesive member ADH, ADV may be fixed to the side frame 140. A plurality of side adhesive members ADH and ADV may be provided. Each of the plurality of side adhesive members ADH and ADV may be fixed to each of the first part 141, the second part 142, the third part 143, the fourth part 144, and the fifth part 145 of the side frame 140.

The panel adhesive member AD may be fixed to the flat plate part 130P. A plurality of panel adhesive member AD may be provided. A first panel adhesive member AD1 may be adjacent to the first part 141 of the side frame 140 to extend long in the left and right direction and be fixed to the flat plate part 130P. A seventh panel adhesive member AD7 may be adjacent to the first part 141 of the side frame 140 to extend long in the left and right direction and be fixed to the flat plate part 130P. The seventh panel adhesive member AD7 may be disposed in one line together with the first panel adhesive member AD1.

A second panel adhesive member AD2 may extend long in the left and right direction adjacent to the upper side of the second heat sink HA2 and be fixed to the flat plate part 130P. A third panel adhesive member AD3 may extend long in the left and right direction to be fixed to the flat plate part 130P between the fourth heat sink HA4 and the sixth heat sink HA6. A fourth panel adhesive member AD4 may extend long in the left and right direction to be fixed to the flat plate part 130P between the eighth heat sink HA8 and the tenth heat sink HA10.

A fifth panel adhesive member AD5 may extend long in the left and right direction to be fixed to the flat plate part 130P between the tenth heat sink HA10 and the twelfth heat sink HA12. A sixth panel adhesive member AD6 may extend long in the left and right direction adjacent to the lower side of the twelfth heat sink HA12 and be fixed to the flat plate part 130P.

An eighth panel adhesive member AD8 may extend long in the left and right direction adjacent to the upper side of the first heat sink HA1 and be fixed to the flat plate part 130P. A ninth panel adhesive member AD9 may extend long in the left and right direction to be fixed to the flat plate part 130P between the third heat sink HA3 and the fifth heat sink HA5. A tenth panel adhesive member AD10 may extend long in the left and right direction to be fixed to the flat plate part 130P between the seventh heat sink HA7 and the ninth heat sink HA9.

An eleventh panel adhesive member AD11 may extend long in the left and right direction to be fixed to the flat plate part 130P between the ninth heat sink HA9 and the eleventh heat sink HA11. A twelfth panel adhesive member AD12 may extend long in the left and right direction adjacent to the lower side of the eleventh heat sink HA11 and be fixed to the flat plate part 130P.

Figure 17:
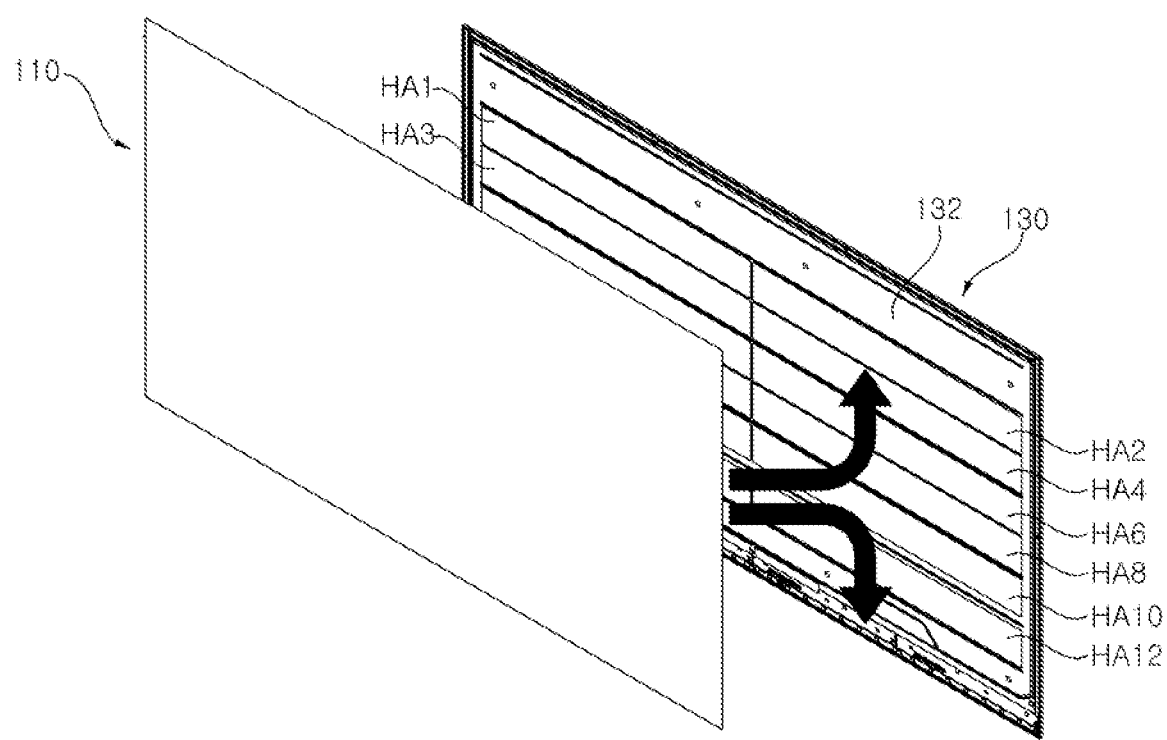
Figure 18:
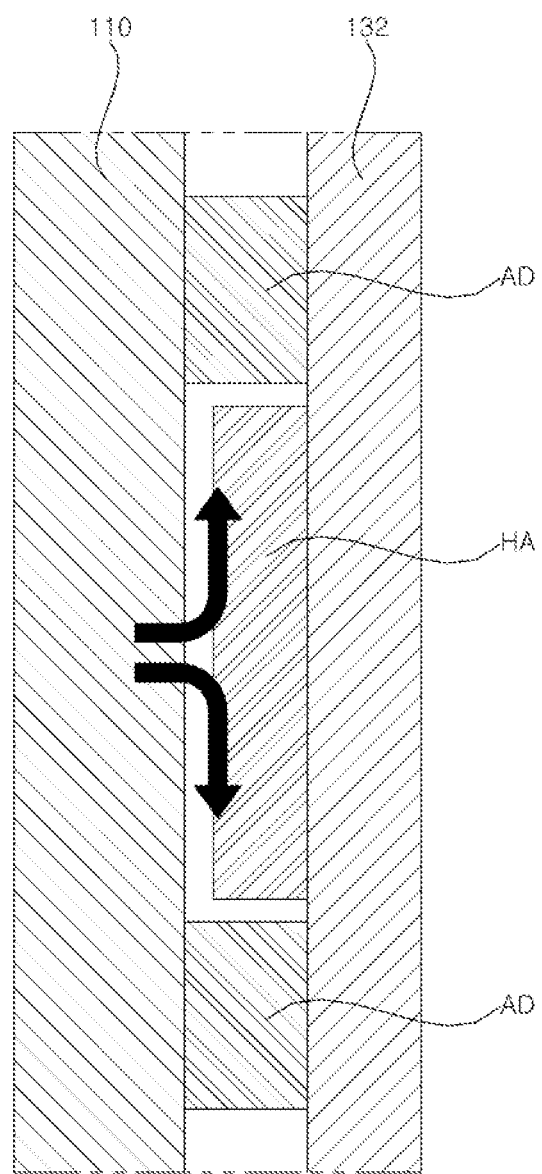

Referring to FIGS. 17 and 18, the display panel 110 may be coupled or fixed to the front skin 132 of the material complexed panel 130 by the adhesive member AD.

The heat sink HA may be located in an air-gap formed between the material complexed panel 130 and the display panel 110. The rear surface of the heat sink HA may be fixed to the front skin 132, and the front surface of the heat sink HA may be spaced apart from the rear surface of the display panel 110.

For example, the thickness of the adhesive member AD may be 0.2 to 0.4 mm. For example, the thickness of the heat sink HA may be 0.15 to 0.25 mm. For example, a gap formed between the display panel 110 and the heat sink HA may be 0.04 to 0.1 mm.

Since a distance of the air-gap is reduced due to the heat sink HA, heat generated in the display panel 110 may be more effectively dissipated.

Figure 19:
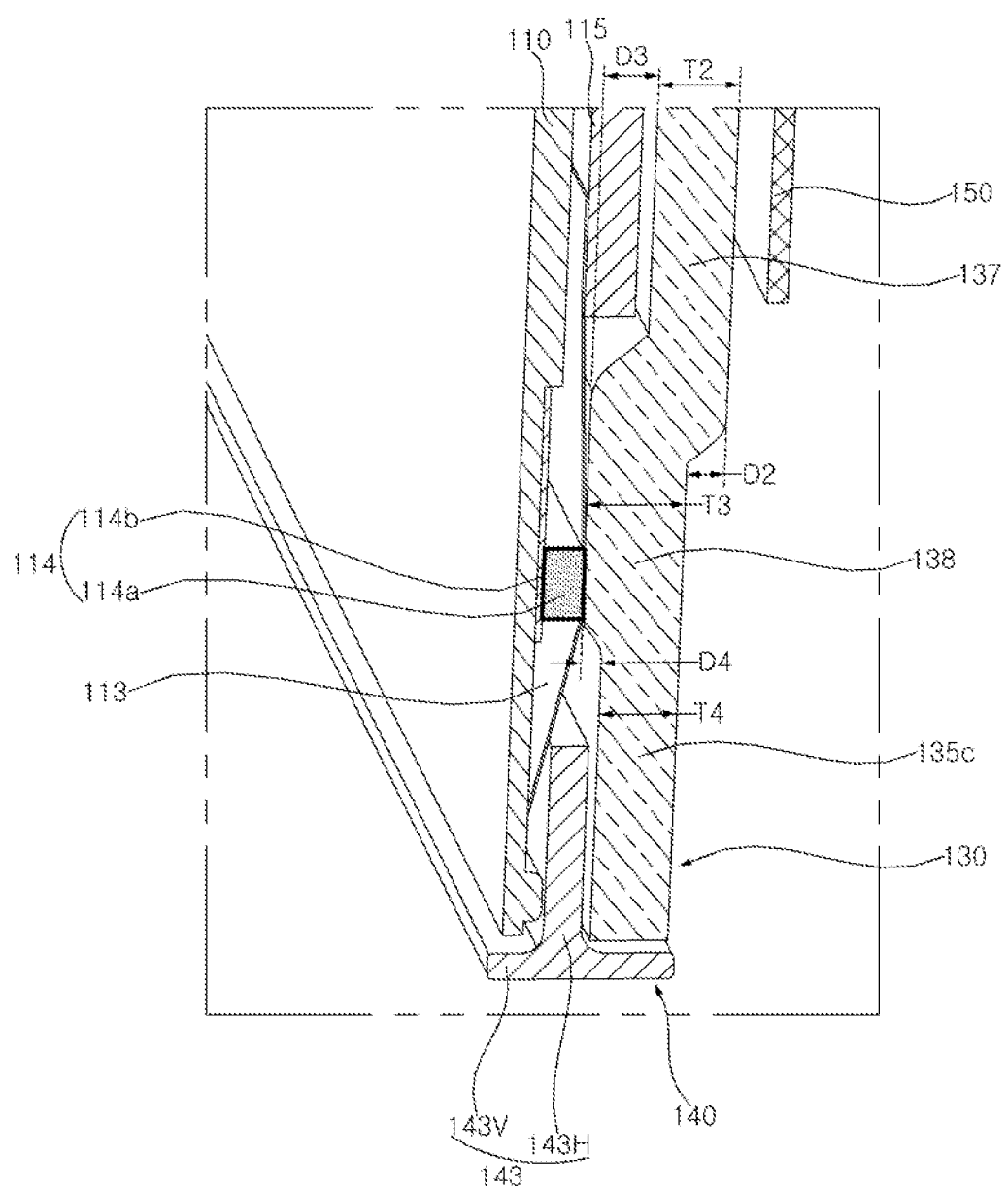

Referring to FIG. 19, the display panel 110 may be coupled or fixed to the side frame 140. The horizontal part 143H of the side frame 140 may support the rear surface of the display panel 110, and the vertical part 143V may cover the side surface of the display panel 110. For example, the vertical part 143V of the third part 143 of the side frame 140 may cover the lower side of the display panel 110.

The vertical part 143V may cover the side surface of the material complexed panel 130. For example, the vertical part 143V of the third part 143 of the side frame 140 may cover the side surface of the third outer part 135c of the material complexed panel 130.

A flexible cable 113 may extend from the lower side of the display panel 110 toward between the display panel 110 and the horizontal part 143H of the side frame 140. The flexible cable 113 may extend between the rear surface of the display panel 110 and the material complexed panel 130. For example, the flexible cable 113 may be a COF 113.

A source signal substrate 115 may be electrically connected to the flexible cable 113. The source signal substrate 115 may be fixed to one surface of the flexible cable 113. For example, the source signal substrate 115 may be an S-PCB 115. The source signal substrate 115 may be located in the receiving part 137 of the material complexed panel 130.

The flexible cable 113 may be located between a protrusion pad 138 of the material complexed panel 130 and the display panel 110. The flexible cable 113 may contact the protrusion pad 138. Heat generated in the source signal substrate 115 and/or the flexible cable 113 may be dissipated through the protrusion pad 138.

A heat dissipation pad 114 may be located between the flexible cable 113 in contact with the protrusion pad 138 and the rear surface of the display panel 110. The heat dissipation pad 114 may include an elastic material 114a and a conductive film 114b. The core 114a of the heat dissipation pad 114 may be formed of an elastic material, and the conductive film 114b may cover the core 114a of the heat dissipation pad 114. Accordingly, it is possible to maintain a state in which the flexible cable 113 is in contact with the protrusion pad 138.

Referring to FIGS. 1 to 19, a display device according to an aspect of the present disclosure includes: a display panel; a material complexed plate located at a rear of the display panel; a side frame which is located between the display panel and the material complexed plate, is fixed to the material complexed plate, and to which the display panel is coupled, wherein the material complexed plate includes: a front skin forming a front surface; a rear skin which forms a rear surface and faces the front skin; and a core which is located between the front skin and the rear skin, and includes fibers.

According to another aspect of the present disclosure, the display device further includes an outer part which is adjacent to a circumference of the material complexed plate, and is formed as the front surface of the front skin is recessed by compressing the core, wherein the side frame includes: a horizontal part located in the outer part between the display panel and the front skin; and a vertical part which extends while intersecting with the horizontal part, and covers a side surface of the display panel or a side surface of the material complexed plate.

According to another aspect of the present disclosure, the material complexed plate includes: a flat plate part; a first outer part forming an upper side of the flat plate part; a second outer part forming a left side of the flat plate part; a third outer part forming a lower side of the flat plate part; a fourth outer part forming a right side of the flat plate part; and a receiving part formed between the third outer part and the flat plate part, wherein the receiving part includes: a receiving part front skin forming a first step difference that is lowered from a front skin of the flat plate part; and a receiving part rear skin forming a second step difference that rises from a rear skin of the flat plate part, wherein a height of the first step difference is higher than a height of the second step difference.

According to another aspect of the present disclosure, the third outer part includes: a front skin of a third outer part forming a third step difference that rises from the receiving part front skin; and a rear skin of the third outer part forming a fourth step difference that is lowered from the receiving part rear skin, wherein a height of the third step difference is higher than a height of the fourth step difference.

According to another aspect of the present disclosure, the material complexed plate includes: a protrusion pad which is located between the receiving part front skin and the front skin of the third outer part, and forms a step difference that rises from the front skin of the third outer part.

According to another aspect of the present disclosure, the display panel further includes: a flexible cable extending from a lower side of the display panel; and a source signal substrate connected to the flexible cable, wherein the source signal substrate is located in the receiving part of the material complexed plate, and the flexible cable is in contact with the protrusion pad.

According to another aspect of the present disclosure, the display device further includes a heat dissipation pad which is located between the flexible cable in contact with the protrusion pad and a rear surface of the display panel.

According to another aspect of the present disclosure, the side frame co includes: a first part extending long along an upper side of the material complexed plate; a second part which is bent from the first part and extends long along a right side of the material complexed plate; a third part which is bent from the second part and extends long along a lower side of the material complexed plate; a fourth part which is bent from the first part and extends long along a left side of the material complexed plate; and a fifth part which is bent from the fourth part and extends long along the lower side of the material complexed plate, wherein a distal end of the fourth part is coupled to a distal end of the fifth part.

According to another aspect of the present disclosure, the material complexed plate includes: a fastening groove formed in the flat plate part, wherein the fastening groove includes: a fastening groove front skin which is formed by recessing the front skin of the flat plate part; a fastening groove rear skin forming the same plane as the rear skin of the flat plate part; and a fastening hole formed to penetrate the fastening groove front skin and the fastening groove rear skin.

According to another aspect of the present disclosure, the display device further includes: a fastening member penetrating the fastening hole, wherein the fastening member includes: a shaft located in the fastening hole; and a head which is connected to the shaft, and located in the fastening groove front skin, wherein a thickness of the head is smaller than a step difference formed by the fastening groove front skin with respect to the front skin of the flat plate part.

According to another aspect of the present disclosure, the display device further includes: a PCB plate which is located to face the display panel with respect to the material complexed plate, and coupled to a rear of the material complexed plate, wherein the PCB plate is fixed to the material complexed plate by the fastening member.

According to another aspect of the present disclosure, the PCB plate includes: a horizontal part; a vertical part which protrudes from the horizontal part and extends long vertically; a horizontal part which protrudes from the horizontal part and extends to left and right; and a recessed part which is formed by recessing the vertical part or the horizontal part, wherein the fastening member is coupled by penetrating the recessed part.

According to another aspect of the present disclosure, a height of the recessed part is higher than a length of the shaft of the fastening member protruding from the recessed part.

According to another aspect of the present disclosure, the side frame includes: a first part extending long along an upper side of the material complexed plate; and a second part which is bent from one end of the first part and extended; wherein the first part includes: a first horizontal part located between the material complexed plate and the display panel; and a first vertical part which extends in a direction intersecting with the first horizontal part, and covers side surfaces of the display panel and the material complexed plate, wherein the second part includes: a second horizontal part located between the material complexed plate and the display panel; and a second vertical part which extends in a direction intersecting with the first horizontal part, and covers side surfaces of the display panel and the material complexed plate, wherein the first vertical part is connected to the second vertical part, and the first horizontal part is spaced apart from the second horizontal part by a gap.

According to another aspect of the present disclosure, the display device further includes: a hole which is located between a corner formed by the first vertical part and the second vertical part and the gap, and is connected to the gap, wherein a size of the hole is larger than a distance of the gap.

The effect of the display device according to the present disclosure will be described as follows.

According to at least one of the embodiments of the present disclosure, it is possible to secure the structural rigidity of a large-screen ultra-thin display device.

According to at least one of the embodiments of the present disclosure, it is possible to provide a display device having a heat dissipation structure capable of dissipating a heat caused due to high image quality.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
a material complexed plate at a rear of the display panel;
a side frame fixed to the material complexed plate between the display panel and the material complexed plate, wherein the display panel is coupled to the side frame,
wherein the material complexed plate comprises:
a front skin forming a front surface;
a rear skin forming a rear surface and facing the front skin; and
a core between the front skin and the rear skin, and including fibers,
wherein the material complexed plate comprises:
a flat plate part facing the display panel;
an outer part at a circumference of the flat plate part;
a receiving part between the flat plate part and the outer part; and
a cable hole disposed at the receiving part,
wherein a front surface of the receiving part is stepped down from a front surface of the flat plate part,
wherein a front surface of the outer part is stepped up from the front surface of the receiving part,
wherein the receiving part and the outer part are formed by compressing the front skin and the core, and
wherein the cable hole is formed by penetrating the front skin, the core, and the rear skin.

2. The display device of claim 1,
wherein the side frame comprises:
a horizontal part located in the outer part between the display panel and the front skin; and
a vertical part extending within an intersecting direction of the horizontal part and covering a side surface of the display panel or a side surface of the material complexed plate.

3. The display device of claim 1, wherein a core in the receiving part of the material complexed part is compressed such that a thickness of the flat plate part is greater than a thickness of the receiving part.

4. The display device of claim 3, wherein a core in the outer part of the material complexed plate is compressed such that the thickness of the flat plate part of the material complexed plate is greater than a thickness of the outer part of the material complexed plate.

5. The display device of claim 4, wherein the material complexed plate comprises a protrusion pad located between the receiving part and the outer part, and
wherein the protrusion pad is stepped up from the outer part and the receiving part of the material complexed plate.

6. The display device of claim 5, wherein the display panel further comprises:
a flexible cable extending from a lower side of the display panel; and
a source signal substrate connected to the flexible cable, wherein the source signal substrate is located in the receiving part of the material complexed plate, and the flexible cable is in contact with the protrusion pad.

7. The display device of claim 6, further comprising a heat dissipation pad which is located between the flexible cable in contact with the protrusion pad and a rear surface of the display panel.

8. The display device of claim 1, wherein the side frame comprises:
a first part extending long along an upper side of the material complexed plate;
a second part which is bent from the first part and extends long along a right side of the material complexed plate;
a third part which is bent from the second part and extends long along a lower side of the material complexed plate;
a fourth part which is bent from the first part and extends long along a left side of the material complexed plate; and
a fifth part which is bent from the fourth part and extends long along the lower side of the material complexed plate,
wherein a distal end of the fourth part is coupled to a distal end of the fifth part.

9. The display device of claim 1, wherein the material complexed plate comprises a fastening groove formed in the flat plate part,
wherein the fastening groove comprises:
a fastening groove front skin which is formed by recessing the front skin of the flat plate part;
a fastening groove rear skin forming the same plane as the rear skin of the flat plate part; and
a fastening hole formed to penetrate the fastening groove front skin and the fastening groove rear skin.

10. The display device of claim 9, further comprising a fastening member penetrating the fastening hole,
wherein the fastening member comprises:
a shaft located in the fastening hole; and
a head which is connected to the shaft, and located in the fastening groove front skin,
wherein a thickness of the head is smaller than a step formed by the fastening groove front skin with respect to the front skin of the flat plate part.

11. The display device of claim 10, further comprising a PCB plate which is opposite to the display panel with respect to the material complexed plate, and coupled to a rear of the material complexed plate,
wherein the PCB plate is fixed to the material complexed plate by the fastening member.

12. The display device of claim 11, wherein the PCB plate comprises:
a plate part;
a vertical part which protrudes from the plate part and extends long vertically;
a horizontal part which protrudes from the plate part and extends to left and right; and
a recessed part which is formed by recessing the vertical part or the horizontal part,
wherein the fastening member is coupled by penetrating the recessed part.

13. The display device of claim 12, wherein a height of the recessed part is higher than a length of the shaft of the fastening member protruding from the recessed part.

14. The display device of claim 1, wherein the side frame comprises:
a first part extending long along an upper side of the material complexed plate; and
a second part which is bent from one end of the first part and extended;
wherein the first part comprises:
a first horizontal part located between the material complexed plate and the display panel; and
a first vertical part which extends in a direction intersecting with the first horizontal part, and covers side surfaces of the display panel and the material complexed plate,
wherein the second part comprises:
a second horizontal part located between the material complexed plate and the display panel; and
a second vertical part which extends in a direction intersecting with the first horizontal part, and covers side surfaces of the display panel and the material complexed plate,
wherein the first vertical part is connected to the second vertical part, and
the first horizontal part is spaced apart from the second horizontal part by a gap.

15. The display device of claim 14, further comprising a hole which is located between a corner formed by the first vertical part and the second vertical part and the gap, and is connected to the gap,
wherein a size of the hole is larger than a distance of the gap.

* * * * *